United States Patent
Wu et al.

(10) Patent No.: US 7,495,489 B2
(45) Date of Patent: Feb. 24, 2009

(54) FREQUENCY MULTIPLYING DELAY-LOCKED LOOP

(75) Inventors: Zuoguo Wu, Santa Clara, CA (US);
Fenardi Thenus, Portland, OR (US);
Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 11/603,531

(22) Filed: Nov. 22, 2006

(65) Prior Publication Data

US 2008/0116951 A1    May 22, 2008

(51) Int. Cl.
*H03L 7/00* (2006.01)
(52) U.S. Cl. ................. 327/161; 327/158
(58) Field of Classification Search ............ 327/149, 327/153, 158, 161
See application file for complete search history.

(56) References Cited

U.S. PATENT DOCUMENTS

| | | | | | |
|---|---|---|---|---|---|
| 5,077,686 | A | * | 12/1991 | Rubinstein | 713/501 |
| 5,463,337 | A | * | 10/1995 | Leonowich | 327/158 |
| 6,107,891 | A | * | 8/2000 | Coy | 331/18 |
| 6,157,226 | A | * | 12/2000 | Ishimi | 327/116 |
| 6,366,150 | B1 | * | 4/2002 | Ishimi | 327/276 |
| 6,380,811 | B1 | * | 4/2002 | Zarubinsky et al. | 331/18 |
| 6,784,707 | B2 | * | 8/2004 | Kim et al. | 327/158 |
| 6,906,566 | B2 | * | 6/2005 | Drexler | 327/158 |
| 6,930,524 | B2 | * | 8/2005 | Drexler | 327/158 |

* cited by examiner

*Primary Examiner*—Lincoln Donovan
*Assistant Examiner*—William Hernandez
(74) *Attorney, Agent, or Firm*—Lee & Hayes, PLLC (57) ABSTRACT

Frequency multiplying delay-locked loop techniques are described in which a plurality of phase shifted signals are generated utilizing a delay-locked loop circuit having a clock multiplication, the phase shifted signals having increased frequency relative to the incoming signal. The phase-shifted signals being generated by the delay-locked loop in order to position the clock to an optimal detection point of incoming data signals.

25 Claims, 7 Drawing Sheets

FREQUENCY MULTIPLYING DELAY-LOCKED LOOP

BACKGROUND

Clock signals in electronic systems may be used for a variety of purposes such as timing and logical sequencing of integrated circuits. In high speed interconnects used in such electronics system, forwarding a high frequency clock may be a limiting factor of performance. Thus, a lower speed clock may be forwarded on an interconnect followed by recovery of the high frequency clock at a receiving device, using a frequency multiplying device. One traditional technique to perform frequency multiplication is through the use of a phase-locked loop (PLL). However, a PLL may be complex and therefore has cost associated with a relatively large silicon area. Further, PLLs have relatively high jitter (phase noise) which may not be suitable for certain high speed interconnects, particularly those employing forwarded clock architecture.

In another traditional technique for frequency multiplying, the edges of an input clock are cycled multiple times through a multiplexer and using a state machine to control a clock edge before it is compared to a subsequent input edge. However, the multiplexer and/or other circuit elements in this type of cycling frequency multiplier may cause errors in the phases spacing, such that evenly spaced output phases may be difficult or even impossible to obtain. Another traditional technique is to use multipliers after the phase generation. However, this involves use of a separate multiplier for each individual phase which adds complexity and cost.

DETAILED DESCRIPTION

In the embodiments below, frequency multiplying delay-locked loop techniques are described in which incoming clock signal frequency may be increased simultaneously with generating multiple phase shifted output signals In one embodiment the incoming clock signal may be configured as clock signal of a component interconnect for an electronic system. In at least some embodiments, frequency multiplying is accomplished by a multiplier portion applied to the incoming clock signal to increase the frequency of the signal. Then the increased frequency signal is input to an array of delay cells in a delay-locked loop portion to produce a plurality of phase shifted output signals having the increased frequency.

Figure 1:
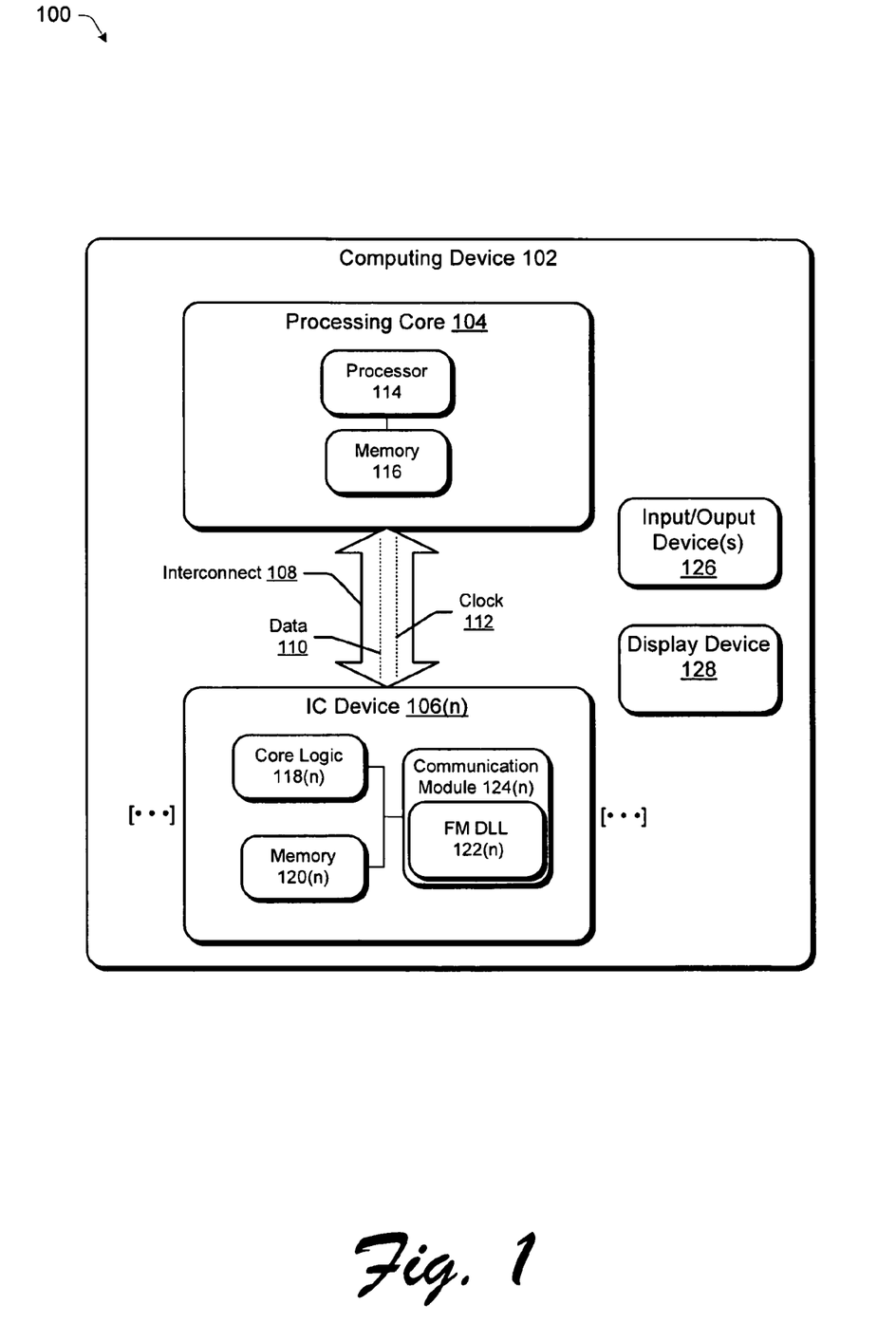
FIG. 1 illustrates an exemplary system in which frequency multiplying delay-locked loop techniques may be employed

FIG. 1 illustrates, generally at 100, an exemplary electronic system in which the described frequency multiplying delay-locked loop techniques may be implemented in accordance with one or more embodiments. A computing device 102 is depicted having a processing core 104 and one or more integrated circuit (IC) devices 106(n) (where "n" may be any integer) which are communicatively coupled via an interconnect 108. The computing device 102 may be configured in a variety of ways, examples of which include but are not limited to a desktop computer, a laptop, game console, set top box, handheld computing device, mobile phone, digital camera, digital recording device, and so forth. The processor core 104 may be configured as a variety of processing devices including but not limited to a central processing unit (CPU) for the computing device 102, a chipset, a memory controller, an input/output controller, a video processor, and so forth. Each of the integrated circuit devices 106(n) may also be configured in a variety of ways to provide different functionality associated with the computing device 102 examples of which include but are not limited to a memory device (such as dynamic random access memory (DRAM), flash memory, dual inline memory module (DIMM) module), a controller for memory, a chipset, an input/output controller, another processing core, a video controller, a graphics processor, a wireless or other network interface device and various other integrated circuit devices 106(n) suitable for implementing the computing device 102.

Interconnect 108 may be configured in a variety of ways examples of which include a high bandwidth processor to processor input/output interconnect, a fully buffered dual inline memory module (FBD2) interconnect, peripheral component interconnect (PCI), high speed serial bus, and so forth. In one embodiment, interconnect 108 may be an interconnect configured for an electronic system 100 which employs a forwarded clock architecture. The interconnect 108 may carry a variety of signals between various components of the electronic system 100, which may include the data signal 110 and a clock signal 112 as illustrated, as well as other signals such as commands, resets and so forth. The interconnect 108, may be a point to point interconnect, a bused interconnect, and so forth. Although the interconnect 108 is depicted as connecting processor core 104 to one or more IC devices 106(n), the interconnect 108 also represents interconnections which may be between a plurality of IC devices 106(n). For instance, the interconnect 108 may communicatively couple various ones of the plurality of the IC devices 106(n) example of which are connecting a memory controller to one or more memory devices, interconnection of a memory controller to a I/O controller, and may even interconnect a processing core 104 to another processing core. A variety of other examples are also contemplated.

The processor core 104 is further depicted as including a processor 114 and a memory 116. Although a single processor 114 and a memory 116 are depicted, processing core 104 may include a variety of processors, processing components, and related memory systems. In an implementation, the processor core 104 may be the main processing unit for the computing device 102. The processor core 104 may be operable to execute a variety of application modules which may also be stored in memory 116 or other suitable storage. Each IC device 106(n) is illustrated as including respective core logic 118(n) and may also include respective memory 120(n). The core logic 118(n) is representative of the primary operations and functionality of the particular device. For example, core logic 118(n) of a memory controller may be configured to provide functionality for management and/or control of associated memory. Naturally, core logic 118(n) may be configured in a variety of ways corresponding to the specific operations and functionality associated with the particular IC device 106(n).

In an implementation, one or more of the IC devices 106(n) include a respective frequency multiplying delay-locked loop (FM DLL) 122(n) in accordance with one or more described embodiments. The FM DLL 122(n) is representative of functionality to receive an input clock signal, such as clock signal 112, and to generate from the input clock signal a plurality of phased shifted output clock signals having increased (e.g., multiplied) frequency. In one or more embodiments, the FM DLL 122(n) may implemented as a portion of a communication 124(n) module which is representative of functionality of the one or more IC devices 106(n) to input/output data, such as via the interconnect 108. Functionality provided by the communication 124(n) module may include but is not limited to communication to various components of the computing device 102, transmitting and receiving of signals via interconnect 108, receiving of the clock signals, generating one or more proper clock signals from an input clock, and so forth. Naturally the FM DLL 122(n) may also be implemented as a stand alone component of the computing device 102 and/or IC device 106(n). Further discussion of devices and techniques to implement a FM DLL 122(n) may be found in relation to the following figures.

Computing device 102 may also include as variety of other components. For instance, computing device 102 in FIG. 1 is depicted as having one or more input/output devices 126, and a display device 128. The one or more input/output devices 126 may include but are not limited a cursor control device (e.g., stylus, trackball, directional keys), a keyboard, speakers, camera, an expansion interface or hub, and so forth. Display 128 may be configured in various ways such as being integrated or external, a liquid crystal display (LCD), a monitor, or other suitable display. Those skilled in the art will appreciate that a variety of other components (not depicted) may also be provided with a computing device 102 a few illustrative examples of which include a power supply, a battery, one or more expansion slots, an antenna, and so forth.

Processors are not limited by the materials from which they are formed or the processing mechanisms employed therein. For example, processors may be comprised of semiconductor(s), transistors (e.g., electronic integrated circuits (ICs)), and/or a variety of other mechanisms. In such a context, processor-executable instructions may be electronically-executable instructions. For example, the processor core 206 may execute one or more modules in response to inputs received from and input/output device such as a cursor control device. Additionally, memories 116, 120 may include a variety of types and combinations of memory, including random access memory (RAM), dynamic random access memory (DRAM), flash memory, hard disk memory, removable medium memory, computer-readable media, and other suitable types of memory.

Generally, any of the functions described herein can be implemented using software, firmware, hardware (e.g., fixed logic circuitry), manual processing, or a combination of these implementations. The terms "module," "functionality," and "logic" as used herein generally represent software, firmware, hardware, or a combination thereof. In the case of a software implementation, for instance, the module, functionality, or logic represents program code that performs specified tasks when executed on a processor (e.g., CPU or CPUs). The program code can be stored in one or more computer readable memory devices, e.g., memory 116. The features of the techniques described below are platform-independent, meaning that the techniques may be implemented on a variety of commercial computing platforms having a variety of processors.

Figure 2:
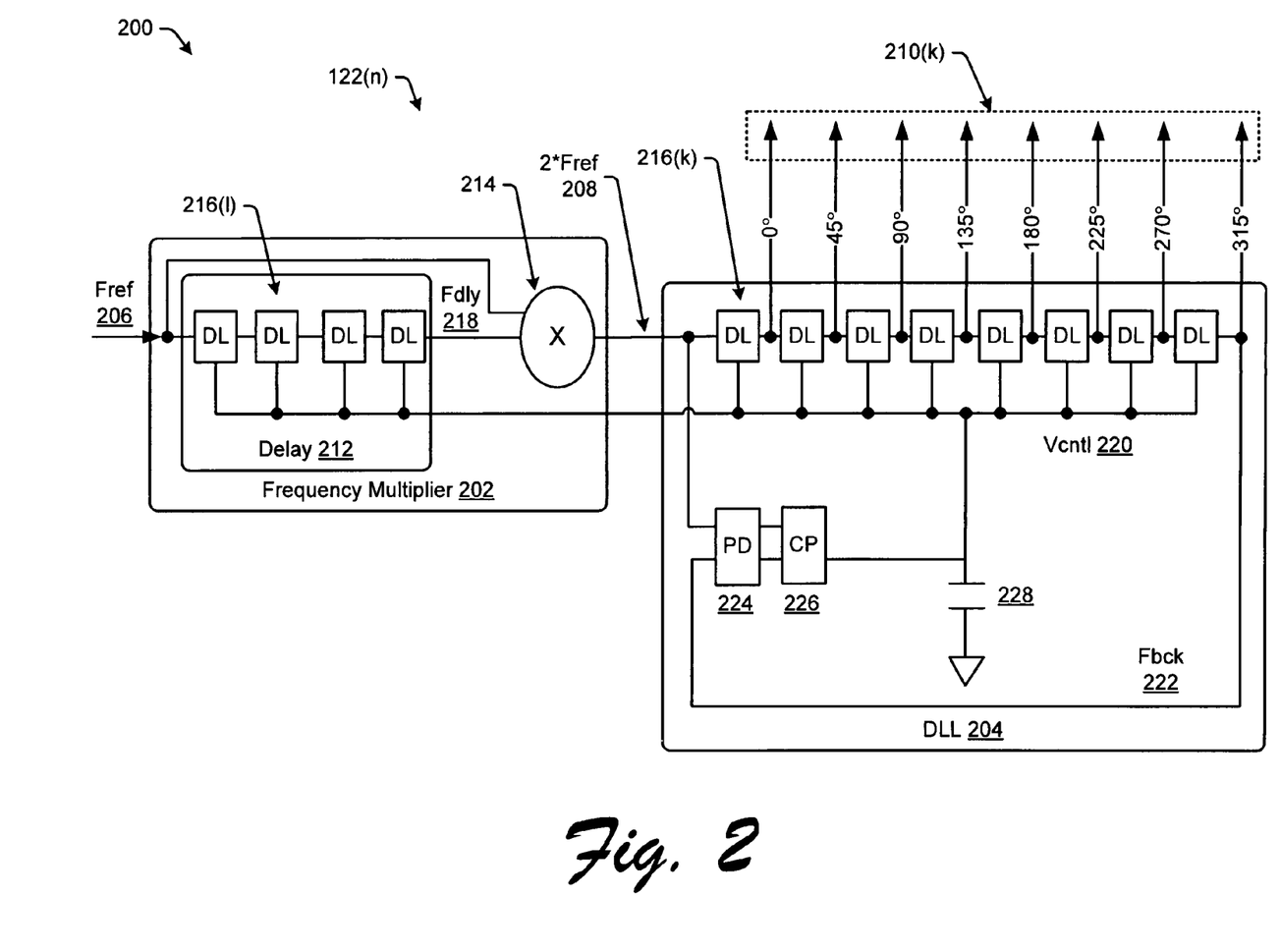
FIG. 2 illustrates an exemplary frequency multiplying delay-locked Loop circuit in accordance with one or more embodiments.

FIG. 2 depicts an exemplary implementation 200 of a FM DLL 122(n) of FIG. 1 in greater detail. In the depicted embodiment the FM DLL 122(n) includes a frequency multiplier 202 portion and a delay-locked loop portion 204. In operation, an incoming clock signal 206 having a reference frequency (Fref) is passed through the frequency multiplier 202 portion to produce an output signal 208 which has a frequency which is increased relative to the incoming clock signal 206. The output signal 208 of the frequency multiplier 202 is then passed (e.g., input) to the delay-locked loop portion 204, which uses the output signal 208 to produce one or more phase shifted signals 210(k) (where "k" may be any integer). The delay-locked loop portion 204 operates at the increased frequency of the output signal 208, thus the one or more of phase shifted signals 210(k) will also have the increased frequency relative to the incoming clock signal 206.

In the implementation of FIG. 2, the multiplier 202 includes a delay array 212 and a doubler 214 configured to produce a doubled frequency. In alternative embodiments the doubler 214 may be replaced with a multiplier to produce a different frequency multiplication, such as four times, eight times and so on. However in FIG. 2 a doubler 214 is provided. Thus, the output signal 208 and the one or more of phase shifted signals 210(k) may be produced having a frequency of twice that of the incoming clock signal 206 (2*Fref). The delay array 212 is illustrated a including a plurality of delay cells 216(l). Each of the delay cells is configured to produce a corresponding delay in the input signal 206. In this instance, four delay cells 216(l) are used to produce a signal 218 which is delayed (e.g., has a delayed frequency of Fdly). The illustrated four delay cells 216(l) in this example generate a delay of exactly one-quarter of the input clock period (Tref) which in an implementation is optimal for the doubler 214. In another instance, the number of delay cells 216(l) may be varied to produce one or more delayed signals such as signal 218 with a delayed period, which may be combined with the input clock signal 206 to produce an output signal 208 in which the frequency has been increased (e.g., multiplied by a selected or predetermined factor). For instance, the input clock 206 and delayed signal 218 as depicted in FIG. 2 are input to the doubler 214 to produce the output signal 208 which has twice the frequency (2*Fref). A variety of other frequency multiplication factors are also contemplated further discussion of which may be found in relation to FIG. 6.

The DLL 204 portion may also include one or more delay cells 216(k) (where "k" may be any integer). The one or more delay cells 216(k) are configured to produce one or more phased shifted outputs 210(k). In an implementation, the number of delay cells 216(k) matches the number of output signals 210(k). Thus, for the depicted implementation in which the output of the DLL is eight frequency doubled clocks signals 210(k), there are eight corresponding delay cells. When the FM DLL 122(n) is locked, each of the delay cells 216(k) produces a delay equal to one sixteenth of the period of the input clock signal 206 (e.g., Tref/16). Further, the DLL 204 portion is configured to produce phase shifted signals 210(k) which are equally spaced one to another (e.g., equally phase difference). Thus, the eight phase shifted signals 210(k) in FIG. 2 are each equally spaced at 45° (e.g., 0, 45, 90, 135, 180, 225, 270, 315) and are at twice the frequency of the input clock signal 206.

It is noted that eight total output clock phases are described by way of illustration and not limitation. In alternative implementations, the number of delay cells 216(k) in a DLL 204 portion may be increased or decreased, which may correspondingly change the number of phased shifted outputs 210(k) which may be generated. Further, in one or more embodiments, the number of phased shifted outputs 210(k) may be different than the number of delay cells 216(k). As an example, the eight depicted delay cells 216(k) may be employed to selectively output certain signals and to deselect others such that they are not output. Thus, signals at 0, 90, 180, and 270 may be output while those at 45, 135, 225, and 315 may be deselected. Likewise, the DLL 204 portion may be configured to output the 0 and 180 signals. The deselecting may involve omission of the outputs in the design of a FM DLL 204 circuit, and/or including functionality to select/deselect possible outputs, such as switches. Thus, various alternative configurations of a DLL 204 portion suitable to produce a plurality of evenly spaced outputs 216(K) are also contemplated.

A control voltage Vcntl 220 is also depicted which is configured to control the operation and/or delay produced by the delay cells 216(l), 216(k). As those skilled in the art will appreciate, the DLL 204 portion may include a feedback line 222, phase detector 224, charge pump 226, and a capacitor 228 which may form a control mechanism for production and control of the Vcntl 220. For instance, variations in phase caused by temperature, line resistance, signal path length and/or various other factors may be compensated for by adjustments to the Vcntl 220. In an implementation, shared voltage control is employed in a FM DLL 122(n) to provide substantially even spacing of clock phases 216(k) For instance, the Vcntl 220 may be configured to be shared between the DLL portion 204 and the frequency multiplier portion 202. With the corresponding delay cells 216(l), 216(k) controlled by the same Vcntl 220, their respective delays may be commonly adjusted and may be maintained substantially constant over process and temperature variations and may also track changes in the input clock signal 206. This may result in substantially consistent delays being produced throughout the FM DLL 122(n), which in turn aids in the generation of precise and equally spaced phases of the phased shifted outputs 210(k).

Thus, the described frequency multiplying delay-locked loop techniques may provide a plurality of phase shifted output clock which have increased frequency relative to an input clock and which are substantially equally spaced. Equal spacing may permit proper operation of a device for which the clock signals may be generated. In certain applications, precise spacing of the clock signals in high speed interconnects may provide optimum results by allowing for proper positioning of clock signals. For example, precise positioning of a communication 124(n) module as in FIG. 1 to retrieve data from an interconnect 108 at the proper point in a data stream may be inhibited when there are phase spacing errors in the output clock phases. Further, the spacing errors may be accentuated as the speed of data transmission increases. Thus, without substantially equally spacing of clock phases, it may be difficult or impossible to obtain the proper clock for positioning the data eye in a communication 124(n) module, a IC device 106(n) and so forth, particularly for high speed interconnects.

Figure 3:
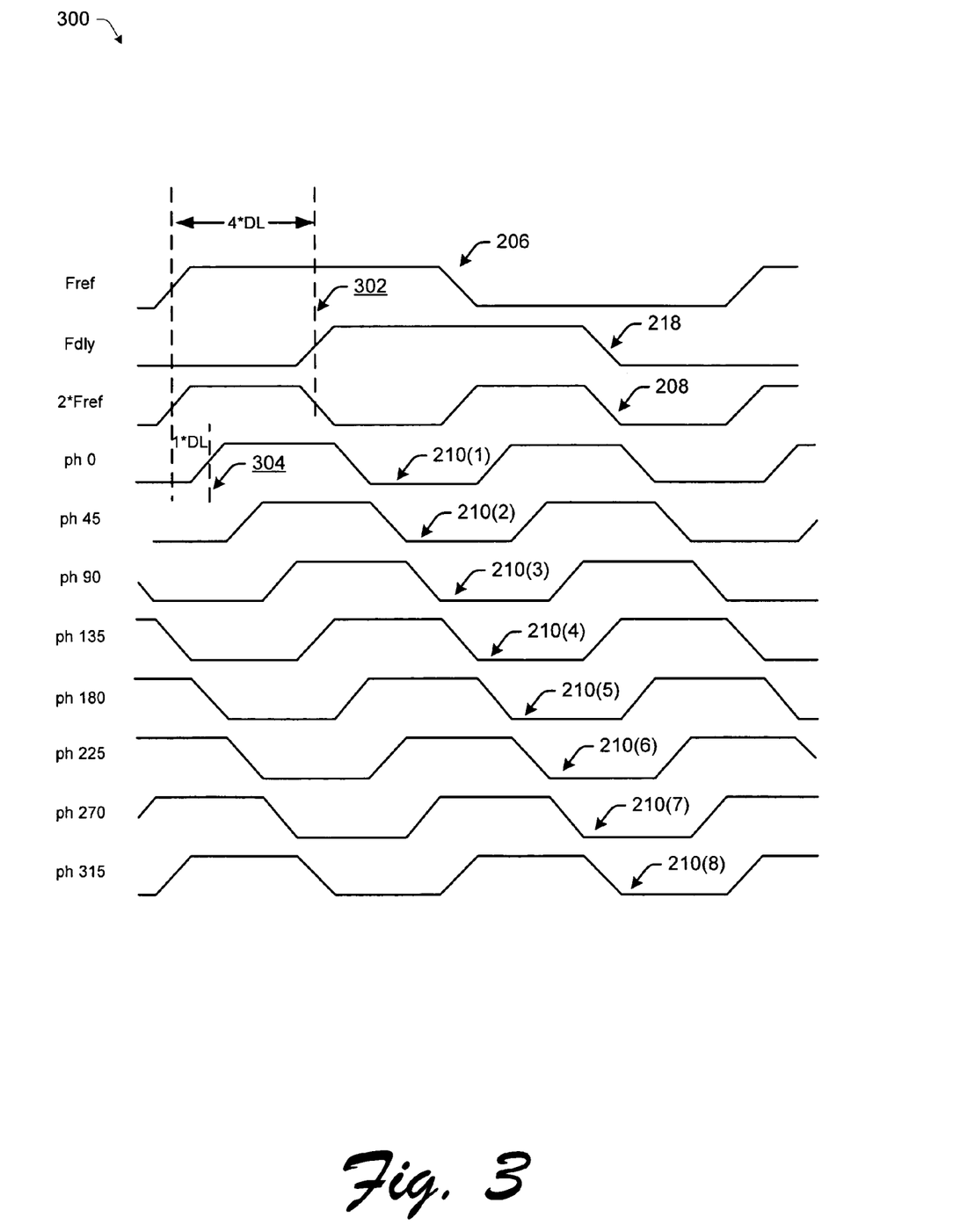
FIG. 3 illustrates an exemplary timing diagram for a frequency multiplying delay-locked loop circuit in accordance with one or more embodiments.

Referring to FIG. 3, a timing diagram is depicted which illustrates the function and timing of the exemplary implementation of a FM DLL 122(n) as in FIG. 2. FIG. 3 depicts the incoming signal 206 which has a clock frequency of Fref and a period Tref. A delay 302 is depicted which corresponds to the to the four delay cells in the delay 212 portion in FIG. 2. The delay is 4*DL where each DL corresponds to Tref/16. Thus, the signal 218 in FIG. 3 represents a delayed version of the input clock 206, which is delayed by one-quarter of Tref (e.g. 4*DL=Tref/4). Thus, the signal 218 has a delayed frequency indicated as Fdly. The input clock signal 206 with Fref and signal 218 with Fdly are input to the doubler 214 of FIG. 2 which produces the signal 208 with 2*Fref.

In the DLL 204 portion, the signal 208 with 2*Fref is input to the array of delay cells 216(k) to produce the plurality of phase shifted outputs 210(k) which in FIG. 3 are shown as the eight phase shifted outputs 210(1) to 201(8). FIG. 3 shows equal spacing of the phase shifted outputs 210(1) to 201(8) that may be obtained using the described techniques. For instance, each of the phase shifted outputs 210(1) to 201(8) is shown as having a respective delay 304 which is 1*DL relative to the previous signal, thus for example 210(1) and 210(2) have a relative delay of 1*DL, as do 210(2) and 210(3) and so forth. For the exemplary FM DLL 122(n) of FIG. 2 configured to produce eight outputs, the DL of the phase shifted outputs 210(1) to 201(8) and cells 216(k) may correspond to Tref/16. Since the DLL 204 portion operates at 2*Fref, the delay of Tref/16 corresponds to a phase difference of 45 degrees between successive ones of the phase shifted outputs 210(1) to 201(8). In particular, the period of the DLL portion (Tdll) equals Tref/2. Thus, the delay DL of Tref/16 equals Tdll/8 which is equivalent to 45 degrees (360/8). Naturally, other values for DL and the phase differences between phase shifted outputs 216(k) are also contemplated, for different applications or data signals and/or when the number of phase shifted outputs 216(k) generated is other than eight.

Figure 4:
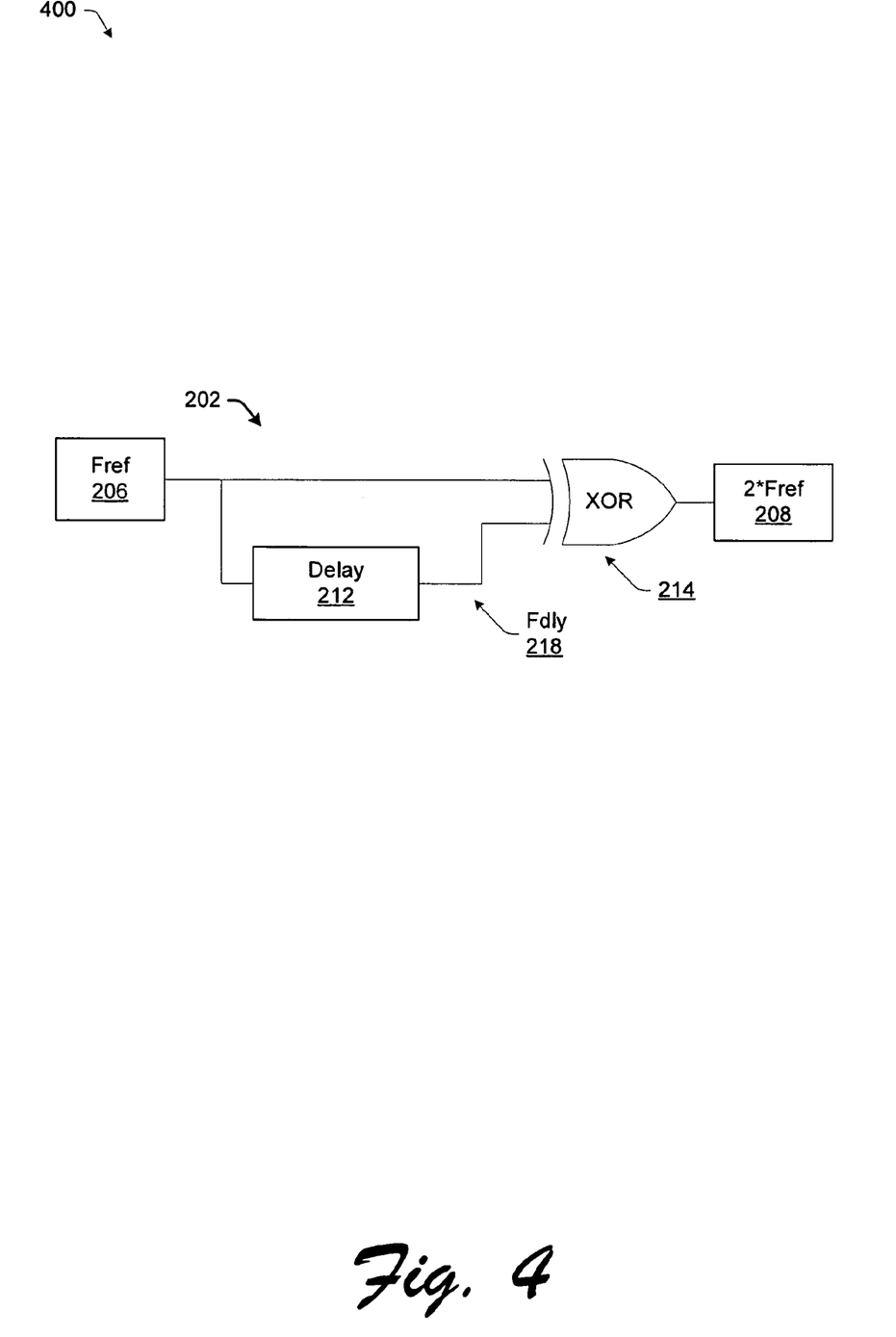
FIG. 4 illustrates an exemplary frequency multiplier in accordance with one or more embodiments.

FIG. 4 depicts an exemplary implementation 400 of a frequency multiplier 202 which may be employed in one or more embodiments. In the implementation, the doubler 214 is implemented as an "exclusive or" (XOR) functional operator. The XOR takes as its inputs the incoming signal 206 with Fref and a delay signal 218 generated via the delay 212 portion. In an implementation, the delay of the signal 218 may be one quarter of the period of the incoming signal 206 The XOR combines the two signals to produce the output signal 208 having increased frequency, such as 2*Fref as shown in FIG. 4. Naturally, the frequency multiplier 202 of FIG. 4 is provided by way of example and not limitation. It is contemplated that a frequency multiplier 202 may be configured in a variety of ways to produce a suitable increased frequency signal 218, the depicted XOR implementation of FIG. 4 being but one illustrative example. Additional examples may be found in reference to exemplary embodiments of a FM DLL 122(n) which are described in the following discussion of FIG. 5 and FIG. 6.

Figure 5:
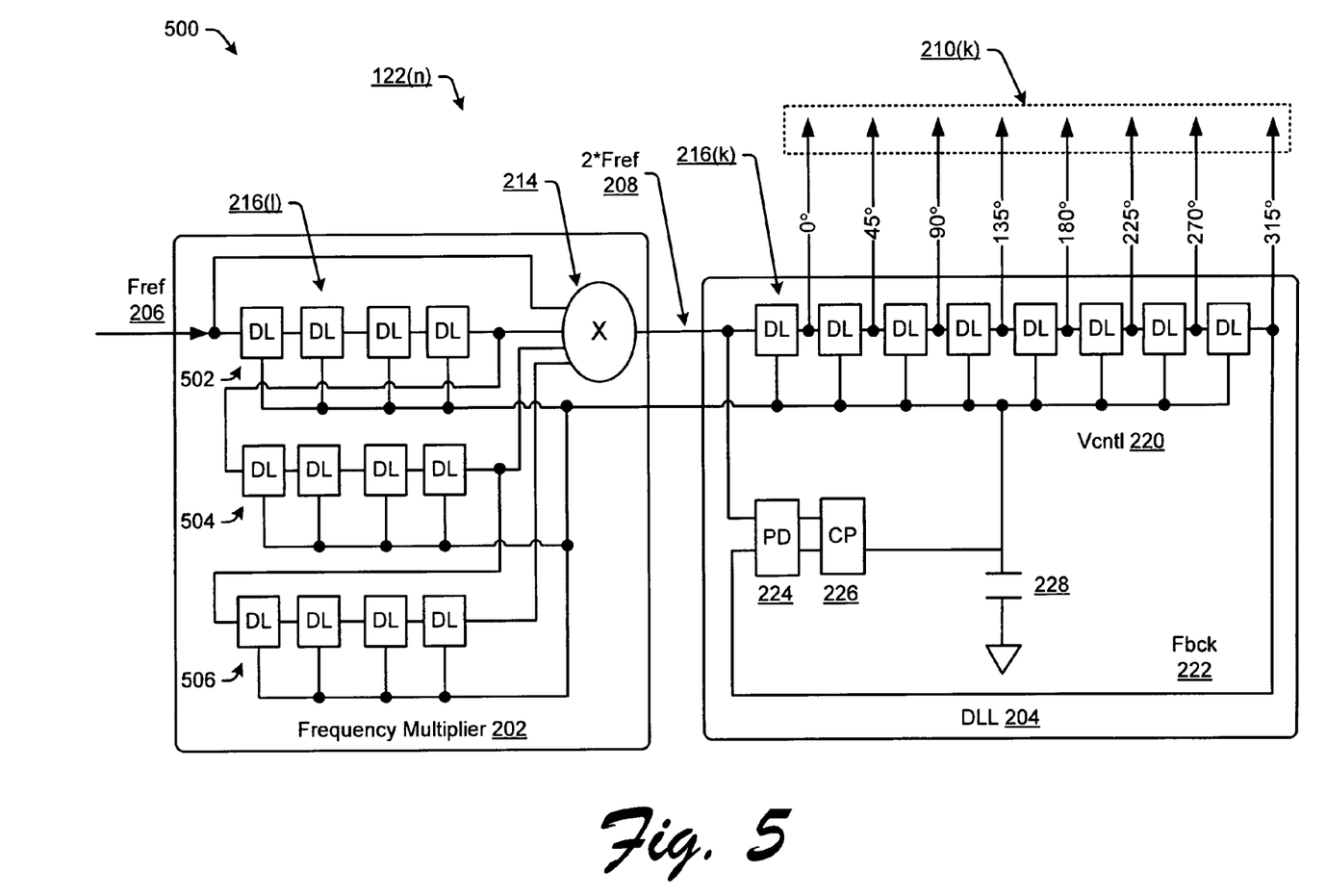
FIG. 5 illustrates another exemplary frequency multiplying delay-locked loop circuit in which a differential frequency multiplier is employed in accordance with one or more embodiments.

FIG. 5 depicts another exemplary implementation 500 of a FM DLL 122(n) of FIG. 1, in which the frequency multiplier 202 is configured to use a differential clock multiplier, which may be full swing, low swing, and so on. In particular, the doubler 214 in FIG. 5 is implemented as a differential clock doubler to produces an output signal 208 with 2*Fref of an input clock signal 206. Those skilled in the art will appreciate that a differential clock multiplier may produce a multiplied signal via four quadrature clock phase inputs. Thus, FIG. 5 depicts four input lines to the doubler 214 implemented as differential clock doubler. Each input line may provide one-quarter period of delay with respect to input clock signal 206. Accordingly, these inputs to the doubler 214 have the relative phase of 0, 90, 180, 270 degrees. The 0 degree phase corresponds to the input signal 206. The relative phases of 90, 180, 270 degrees may be generated by using the delay 212 portion and associated plurality of delay cells 216(1) as previously described in reference to FIG. 2. In the implementation depicted in FIG. 5 the plurality of delay cells 216(1) includes twelve individual delay cells arranged in three sets 502, 504, 506 of four delay cells each, such that each set produces a respective one-quarter delay in the period. The signal is successively routed through the sets and the delayed signal after each set is provided as an input to the multiplier 214. The resulting signals having the relative phases of 90, 180, 270 degrees are input along with the input signal 206 to the doubler 214 to produce the doubled frequency output signal 208.

Figure 6:
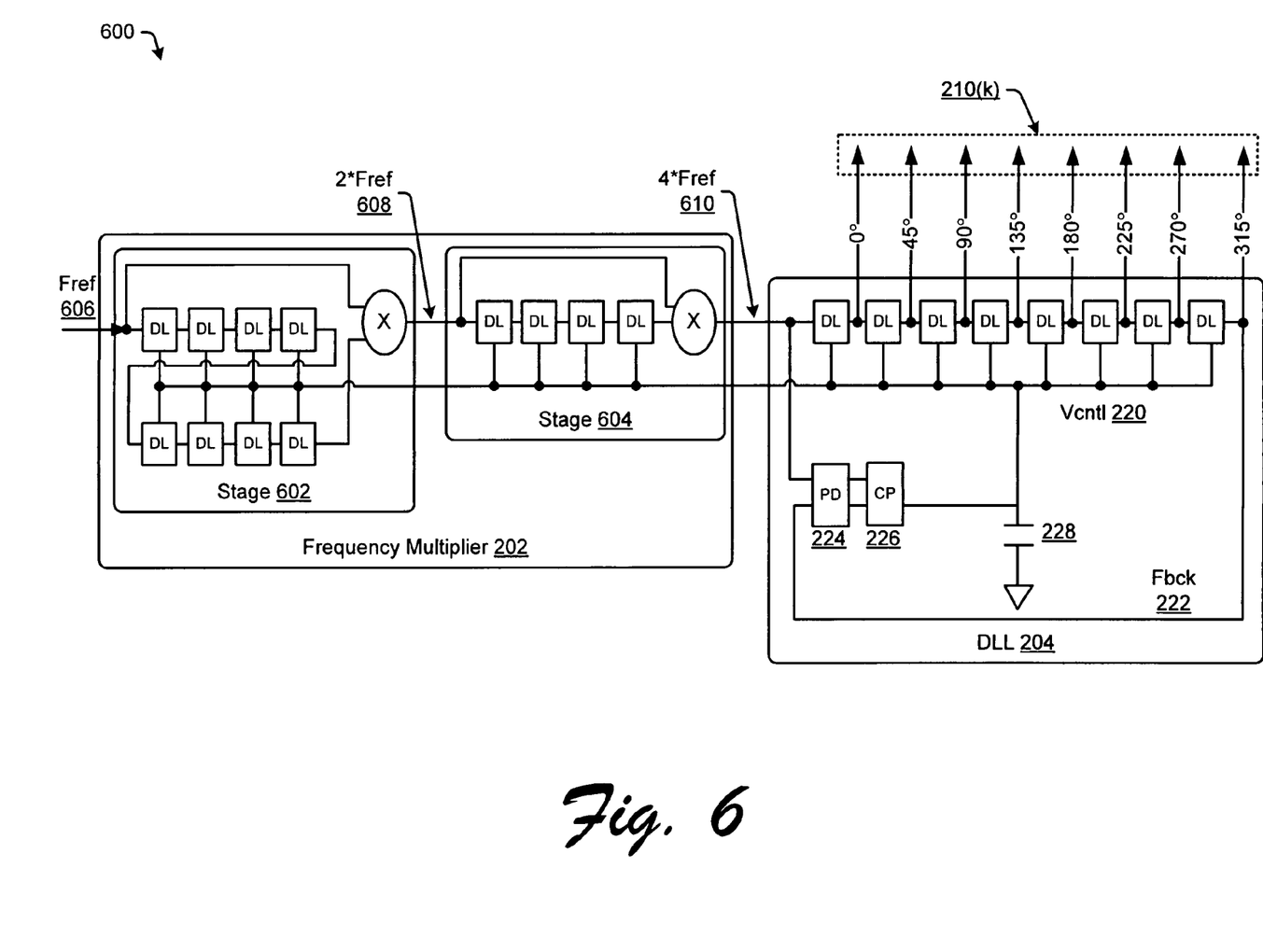
FIG. 6 illustrates another exemplary frequency multiplying delay-locked loop circuit in which a plurality of frequency multiplier stages is employed in accordance with one or more embodiments.

FIG. 6 shows another exemplary implementation 600 of a FM DLL 122(n) configured to provide greater increases in frequency. As noted previously, a FM DLL 122(n) may be configured to provide multiplication factors other than 2 times. FM DLL 122(n) depicted in FIG. 6 is configured to produce a frequency increase of four times that of the input signal. The frequency multiplier 202 includes a plurality of stages 602, 604 each of which is to perform a respective doubling of the frequency. In operation, the input clock 606 may be received at the FM DLL 122(n) and input to the stage 602. Stage 602 is configured to produce an output signal 608 having a frequency which is 2*Fref. The signal 608 is then provided as an input to stage 604. Stage 604 is configured to produce an output signal 610 having a frequency which is 4*Fref. Output signal 610 is provided to the DLL 204 portion, which operates at 4*Fref and produces a plurality of phase shifted outputs 216(k) as previously described, which naturally also have frequency of 4*Fref. It is noted that as with the implementation 200 of FIG. 2, the Vcntl 220 of the DLL 204 portion may be shared with each of the plurality of stages 602, 604 of the frequency multiplier 202. This may again permit the generation of a plurality of phase shifted outputs 210(k) (e.g., clock signals) which are substantially equally spaced. Although FIG. 6 depicts two stages 602, 604 those skilled in the art that a FM DLL 122(n) may be implemented with additional stages in succession to produce even greater multiplication such as 8 times, 16 times and so on.

In an implementation, odd multiplication ratios are also contemplated. For example, the XOR type frequency multipliers 202 as in FIG. 4 may be replaced by frequency up-converting mixers which are configured to generate odd multiplication factors, e.g., 3 times, 5 times and so on. In combination with frequency multipliers 202 configured to double the frequency, the frequency up-converting mixers may also be used to create ratios of 6 times, 10 times and so forth. The described frequency multiplying delay-locked loop techniques thus provide efficient and cost effective devices and mechanisms for frequency multiplication and phase shifted outputs, which may achieve substantially equally spaced phases.

The following procedures are shown as a set of blocks that specify operations performed by one or more devices and are not necessarily limited to the orders shown for performing the operations by the respective blocks. In the course of discussing the following procedures, reference may be made to the previously described devices and techniques.

Figure 7:
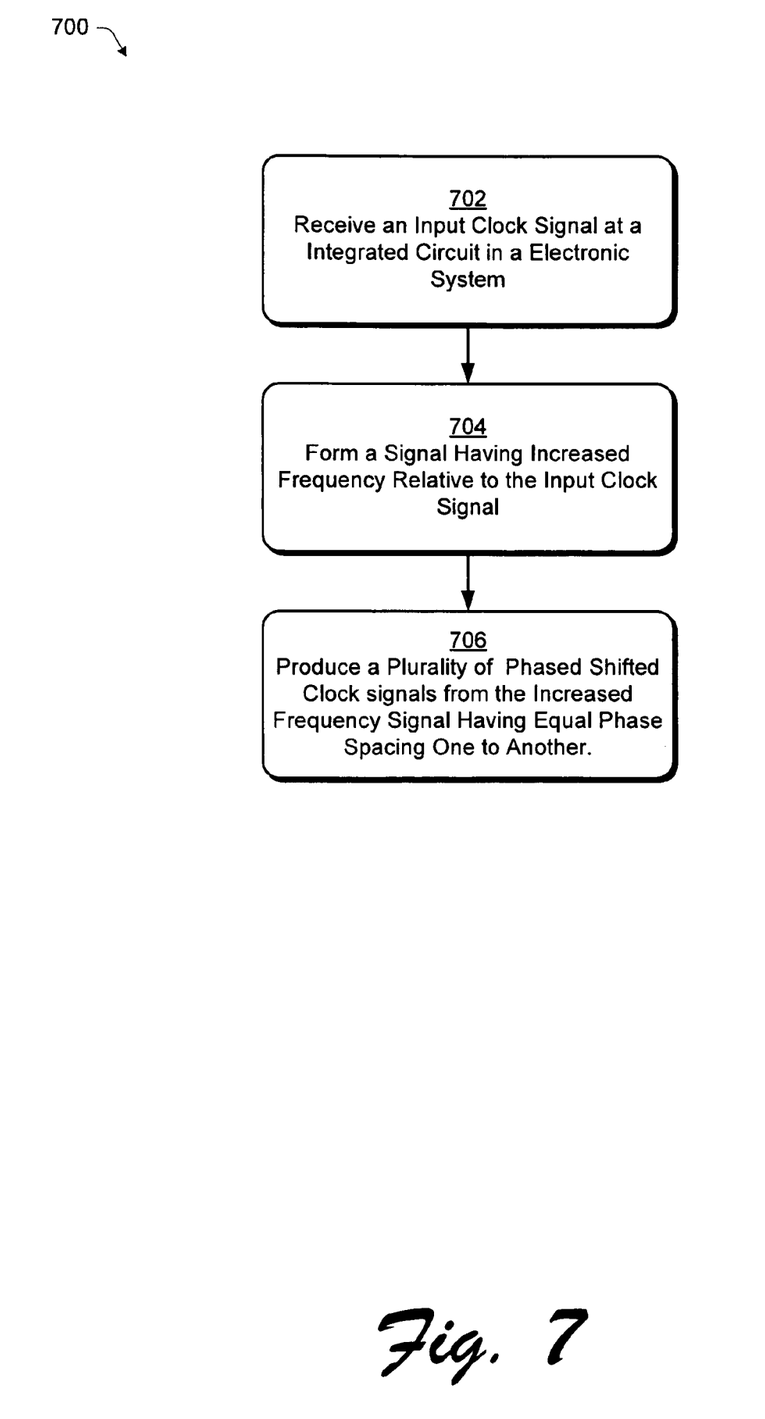
FIG. 7 is a flow diagram of an exemplary procedure in which frequency multiplying delay-locked loop circuit is used to produce a plurality of even spaced output clock signals in accordance with one or more embodiments.

FIG. 7 is a flow diagram of an exemplary procedure 700 in which a frequency multiplying delay-locked loop circuit in accordance with one or more embodiments is used to produce a plurality of equally spaced output clock signals. An input clock signal is received at an integrated circuit device in an electronic system (block 702). For instance, the computing device 102 of FIG. 1 may generate clock and/or data signal which may be communicated between various components of the computing system via an interconnect 108. In one example, the processor core 104 may execute code which causes certain data to be communicated to an IC device 106(n) which for the purposes of example may be application data which is communicated to a memory controller. A variety of other examples are also contemplated. Clock signals may also be forwarded to the IC device 106(n) to control timing, sequencing and so forth of operations at the IC device 106(n). The IC device 106(n) may include a communication module 124(n) which may be configured to receive and/or transmit data, clock signals, and so forth via the interconnect 108. In another implementation, the input clock signal 206 may be received directly at a FM DLL 122(n). Thus, a clock signal communicated via interconnect 108 may be received as an input clock signal 206 at an IC device 106(n).

Then, the input clock signal is used to form a signal having increased frequency relative to the input clock (block 704). The receiving IC 106(n) of the previous example may include a respective FM DLL 122(n) in accordance with one or more described embodiments. For example, the memory controller in the preceding example may include the FM DLL 112(n) which includes a frequency multiplier 202 as in FIG. 2. The input clock signal 206 of FIG. 2 is input to the frequency multiplier 202 to form an output signal 208 with increased frequency relative to the input clock signal 206. In an implementation as depicted in FIG. 2 the frequency multiplier 202 is configured to double the frequency such that input clock signal 206 has frequency Fref, and the output 208 has frequency of 2*Fref. In other implementations, the FM DLL 122(n) may be configured to increase the frequency of an input signal by a variety of factors such as two times, three times, four times and so forth.

A plurality of evenly spaced output clock signals is produced from the signal having increased frequency (block 706). Following the previous example, the output signal 208 having the increased frequency is provided as an input to the DLL 204 portion of the FM DLL 122(n). The DLL 204 portion includes a plurality of delay cells 216(k), each of which produces a respective phase delay. The delay cells 216(k) are arranged sequentially to produce successively increasing delay relative to the input signal 208. 210(k). In the implementation of FIG. 2 for example eight delay cells 216(k) are utilized to produce eight corresponding phase shifted output signals 210(k). For instance, the phase delay between each of the plurality of phase shifted outputs 210(k) may be 45 degrees as illustrated in FIGS. 2-3.

It is again noted that the DLL 204 operates at the increased frequency of the input signal 208. Thus, the plurality of phased shifted outputs 210(k) is formed having the increased frequency. Further, since the increase in frequency may occur before the DLL 204 portion, the number of delay cells 216(k) in the DLL portion may be minimized which permits a smaller silicon area and lower cost. Thus, the number of delay cells 216(k) in a DLL 204 portion may match the number of phase shifted output signals 210(k) produced. Further common voltage control, Vcntl 220, may be used for each delay cell in a FM DLL 122(n) circuit (e.g., common control of the frequency multiplier 202 portion and DLL 204 portion). The commonly shared Vcntl 220 along with the minimization of components (e.g., low number of delay cells 216(k), no multiplexer or clock cycling) may result in reduced signal jitter, line losses, delay offset, and so forth Thus, spacing errors commonly encountered in traditional techniques may be avoided and a plurality of phase shifted outputs 210(k) which are substantially equally spaced may be obtained.

One or more of the phase shifted outputs 210(k) may then be used to provide a proper clock for an operation of the IC device 106(n) or other components of the computing device 102. For instance, one or more of the output clock signal may be used to position a communication module 124(n) to receive data at a particular point in a data stream received via an interconnect 108. Another one of the output clock signals may be used to form and/or transmit data which is in a particular configuration (e.g., at the proper phase, includes a particular clock, and so forth) corresponding to another component of the computing system. Those skilled in the art will appreciate a variety of other uses for the equally spaced phase shifted outputs 210(k) which have increased frequency relative to the input clock signals.

CONCLUSION

Although the embodiments have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. An apparatus comprising:
   a multiplier portion to form a signal having increased frequency relative to an input clock signal from which the multiplier portion forms the signal having the increased frequency, wherein the multiplier portion includes a plurality of stages each of which is to produce a respective doubling of the frequency relative to the input clock signal; and
   a delay-locked loop (DLL) portion to produce a plurality of phase shifted outputs from the signal having the increased frequency.

2. An apparatus as recited in claim 1, wherein the plurality of phase shifted outputs have equal phase spacing one to another.

3. An apparatus as recited in claim 1, wherein the delay-locked loop (DLL) portion operates at the increased frequency.

4. An apparatus as recited in claim 1, wherein the delay-locked loop (DLL) portion has a plurality of delay cells arranged in series to produce the plurality of phase shifted outputs.

5. An apparatus as recited in claim 4, wherein the number of delay cells in the delay-locked loop (DLL) portion is equal to the number of phase shifted outputs produced.

6. An apparatus as recited in claim 1, wherein the increased frequency of the plurality of phase shifted output signals is increased four times relative to the input clock signal.

7. An apparatus as recited in claim 1, wherein:
   the multiplier portion is to provide a signal having double the frequency of the input clock signal to the delay-locked loop portion, and;
   the delay-locked loop portion is to produce eight equally spaced phase shifted outputs from the signal provided by the multiplier portion.

8. An apparatus as recited in claim 7, wherein the eight equally spaced phase shifted outputs are spaced 45 degrees apart.

9. An apparatus as recited in claim 1, further comprising a control mechanism which provides voltage control shared by the multiplier portion and the delay-locked loop.

10. A method comprising:
    receiving an input clock signal at a first integrated circuit of an electronic system;
    forming from the input clock signal, a clock signal having increased frequency relative to input clock signal, wherein the forming occurs via a multiplier portion of the first integrated circuit having:
      a plurality of delay cells to produce a delayed version of the input clock signal; and
      a multiplier device to produce the signal having increased frequency from the input clock signal and the delayed version of the input clock signal; and
    producing from the increased frequency clock signal a plurality of phase shifted outputs having equal phase spacing one to another.

11. A method as recited in claim 10, wherein the plurality of phase shifted outputs each have the increased frequency relative to the input clock signal.

12. A method as recited in claim 10, wherein the input clock signal is received via a component interconnect from a second integrated circuit of the electronic system.

13. A method as recited in claim 10, wherein the plurality of phase shifted output signals are to control the timing of one or more operations of the first integrated circuit.

14. A method as recited in claim 10, wherein the producing occurs via a delay-locked loop (DLL) portion having a plurality of delay cells to produce the plurality of phase shifted outputs.

15. A method as recited in claim 14, wherein the delay-locked loop (DLL) portion operates at the increased frequency.

16. A method as recited in claim 10, wherein the increased frequency is increased at least four times relative to the input clock signal.

17. A method as recited in claim 10, wherein:
    the forming occurs via a multiplier portion of the first integrated circuit having:
    a plurality of delay cells to produce a delayed version of the input clock signal; and
    a multiplier device to form the signal having increased frequency from the input clock signal and the delayed version of the input clock signal,
    the producing occurs via a delay-locked loop (DLL) portion of the first integrated circuit having a plurality of delay cells arranged in series to produce the plurality of phase shifted outputs;
    the multiplier portion is to provide a signal having double the frequency of the input clock signal to the delay-locked loop (DLL) portion, and
    the delay-locked loop (DLL) portion is to produce eight equally spaced phase shifted outputs from the signal provided by the multiplier portion.

18. A system comprising:
    a processor core having a dynamic random access memory (dram); and
    a circuit to produce a plurality of phase shifted output clock signals from an input clock signal, the circuit having:
      a multiplier portion to receive the input clock signal and form a signal having increased frequency relative to the input clock signal;
      a delay-locked loop (DLL) portion to receive the signal formed by the multiplier portion and produce the plurality of phase shifted output clock signals having the increased frequency; and
      a control mechanism which provides voltage control shared by the multiplier portion and the delay-locked loop.

19. A system as recited in claim 18 wherein the plurality of phase shifted output clock signals have equal phase spacing one to another.

20. A system as recited in claim 18, wherein the increased frequency is increased at least three times relative to the input clock signal.

21. A system as recited in claim 16, wherein
the multiplier portion is to double the frequency of the input clock signal, and;
the delay-locked loop (DLL) portion is to produce eight evenly spaced phase shifted output clock signals.

22. An apparatus comprising:
a multiplier portion to form a signal having increased frequency relative to an input clock signal from which the multiplier portion forms the signal having the increased frequency, wherein the multiplier portion includes:
   a plurality of delay cells to produce a delayed version of the input clock signal; and
   a multiplier device to form the signal having increased frequency from the input clock signal and the delayed version of the input clock signal; and
a delay-locked loop (DLL) portion to produce a plurality of phase shifted outputs from the signal having the increased frequency.

23. An apparatus as recited in claim 22, wherein the multiplier device is to double the frequency of the input clock signal.

24. An apparatus comprising:
a multiplier portion to form a signal having increased frequency relative to a input clock signal from which the multiplier portion forms the signal having the increased frequency;
a delay-locked loop (DLL) portion to produce a plurality of phase shifted outputs from the signal having the increased frequency; and
a control mechanism which provides voltage control shared by the multiplier portion and the delay-locked loop.

25. A method comprising:
receiving an input clock signal at a first integrated circuit of an electronic system;
forming from the input clock signal, a clock signal having increased frequency relative to input clock signal, the forming occurs via a multiplier portion of the first integrated circuit having:
   a plurality of delay cells to produce a delayed version of the input clock signal; and
   a multiplier device to form the signal having increased frequency from the input clock signal and the delayed version of the input clock signal;
producing from the increased frequency clock signal a plurality of phase shifted outputs having equal phase spacing one to another, the producing occurs via a delay-locked loop (DLL) portion of the first integrated circuit having a plurality of delay cells arranged in series to produce the plurality of phase shifted outputs;
the multiplier portion is to provide a signal having double the frequency of the input clock signal to the delay-locked loop (DLL) portion, and
the delay-locked loop (DLL) portion is to produce eight equally spaced phase shifted outputs from the signal provided by the multiplier portion.

* * * * *